United States Patent [19]

Harper, Jr. et al.

[11] Patent Number: 5,314,223
[45] Date of Patent: May 24, 1994

[54] VACUUM PLACEMENT SYSTEM AND METHOD, AND TOOL FOR USE THEREIN

[75] Inventors: Donald K. Harper, Jr., Harrisburg; Michael F. Laub, Etters, both of Pa.

[73] Assignee: The Whitaker Corporation, Wilmington, Del.

[21] Appl. No.: 23,287

[22] Filed: Feb. 26, 1993

[51] Int. Cl.$^5$ .............................................. H05K 13/04
[52] U.S. Cl. ....................................... 294/64.1; 29/743; 29/758
[58] Field of Search .............................. 294/64.1–64.3, 294/2, 86.4; 29/743, 744, 758, 759; 116/230, 264, 266, 272

[56] References Cited

U.S. PATENT DOCUMENTS

| | | | |
|---|---|---|---|
| 3,896,533 | 7/1975 | Ullman et al. | 29/758 X |
| 4,479,298 | 10/1984 | Hug | 29/759 X |
| 4,528,746 | 7/1985 | Yoshimura | 29/743 |
| 4,604,796 | 8/1986 | Tsipenyuk et al. | 29/758 X |
| 4,615,110 | 10/1986 | Crone | 29/758 X |
| 4,631,815 | 12/1986 | Bocchicchio et al. | 29/743 X |
| 4,733,462 | 3/1988 | Kawatani | 29/759 X |
| 4,883,300 | 11/1989 | Akagawa | 29/743 X |
| 4,951,240 | 8/1990 | Fukino | 29/759 X |
| 4,956,911 | 9/1990 | Zaremba et al. | 29/743 X |

*Primary Examiner*—Dean J. Kramer
*Attorney, Agent, or Firm*—Driscoll A. Nina, Jr.

[57] ABSTRACT

A system for conveying chips from a container to a predetermined position on top of a chip socket. A vacuum-held hand tool having a handle is supplied with a vacuum or with a positive air pressure at its working face, as controlled by placement of a digit of the operator with respect to an air exhaust port on the handle. The bottom or working face of the tool is provided with a recess fitting the outline of a chip to be picked up by the tool working face, to hold the chip fixed on the tool as it is carried by the tool to a position atop the socket, where it is discharged by flow of air from the working face when a digit of the operator is applied to the exhaust port of the tool. A first set of pins protruding normally from the working face of the tool assures proper lateral positioning of the tool with respect to the container in which the chip is originally located, by mating with depressions in the container, and a second set of pins protruding from the working face assure proper lateral positioning of the tool and chip with respect to the socket by fitting against the socket near its corners. Indicia on the tool cooperate with corresponding indicia on the container and socket, to aid in proper orientation of tool with chip during pick-up and tool with socket during chip discharge.

10 Claims, 10 Drawing Sheets

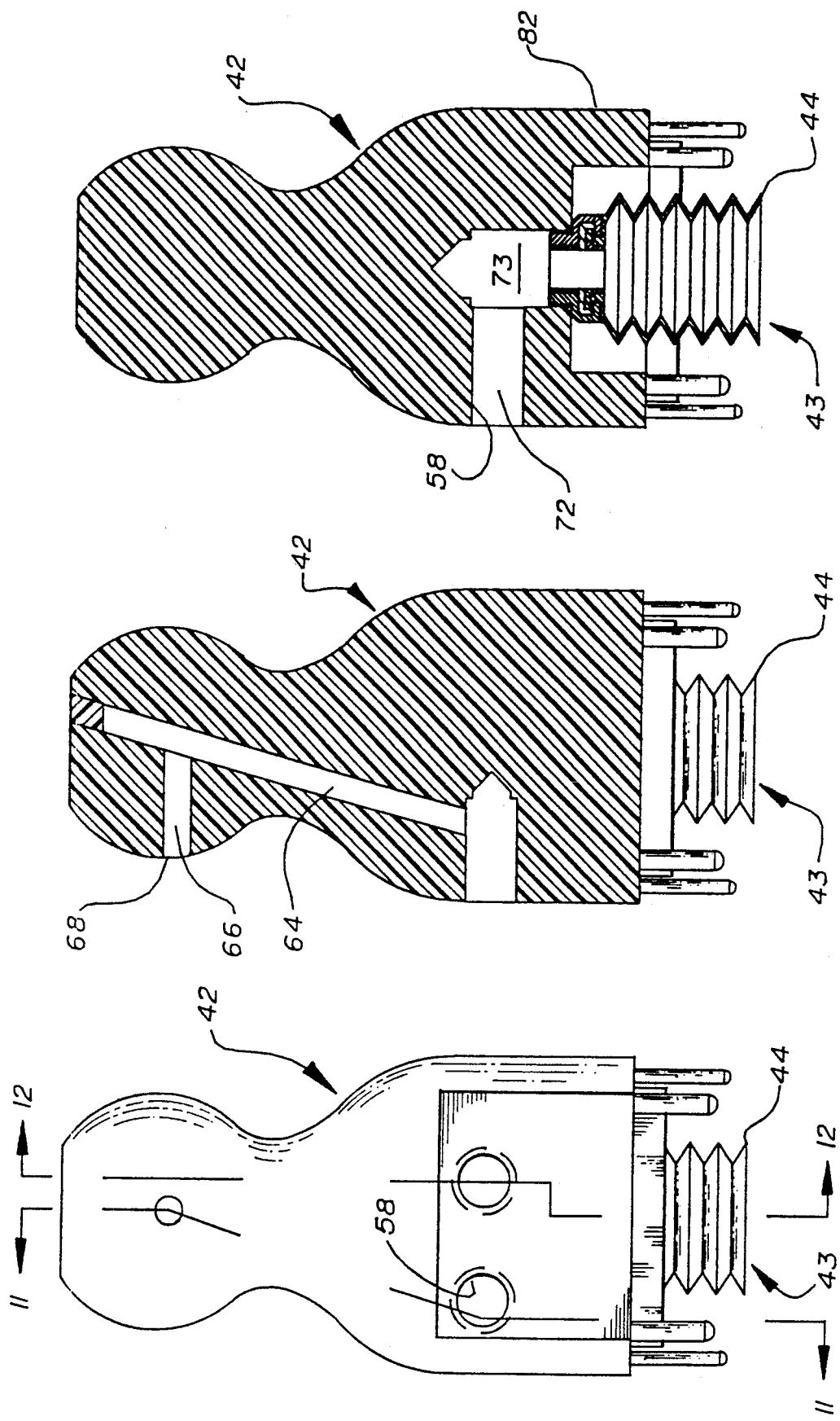

VACUUM PLACEMENT SYSTEM AND METHOD, AND TOOL FOR USE THEREIN

FIELD OF THE INVENTION

This invention relates to a system and method for picking up a computer chip with the aid of a hand-held tool, visually inspecting it, and then placing it into a socket on a printed circuit board; it relates also to a vacuum hand tool for use in performing these functions.

BACKGROUND OF THE INVENTION

Computer chips, with leads extends from their edges, are often presented by a supplier to a user in a storage tray having in it one or more molded pockets, in each of which a computer chip lies flat; in certain forms of such tray, a plurality of small depressions are also molded in the tray around each pocket. It is also now known to provide a socket for the chip, typically with its leads appropriately soldered to solder pads on a printed-circuit board for example, and to which socket the chip is to be transferred, so that the chip can thereafter readily be removed from the socket and replaced by another, for example, without requiring unsoldering or resoldering of the chip leads. In certain cases the socket has post-like protrusions extending upwardly at points about its periphery, for example at each of the four corners of a socket in the case of a generally square chip, and the chip is held in position on the socket by a locking cover applied from the top.

Manual lifting of the chip from the tray and placing of the chip in the socket has heretofore been performed by direct hand contact with the chip, or by lifting it with a simple vacuum hand tool. In the course of lifting the chips from the tray and placing them in their sockets, it has been customary to inspect them visually, for example for broken, damaged or improperly bent leads, in the course of which examination the chip is usually turned to examine it from all sides and from its bottom.

It is of course generally desirable to perform this lift-examine-place procedure as quickly as possible, using operators who are not necessarily highly skilled or trained, and in some cases not even highly reliable. Under these conditions especially, improper manual placement of the chips in their sockets can sometimes occur; this is a serious error which can result in fatal damage to the chip and/or inoperativeness of the system in which the chip is connected, and at least in costly delay.

A principal object of the present invention is to provide a new system, method and tool for manually lifting a chip from its container for inspection, and subsequently placing it correctly on a socket, in a manner which is substantially fool-proof and very unlikely to result in any error in such lifting and placing.

SUMMARY OF THE INVENTION

In accordance with the invention, a hand-held vacuum tool is provided which is visually keyed to the container which holds the chips so that the chip will be picked up by the tool in only the desired orientation of the tool with respect to chip, and is physically keyed to the chip container so that the tool is easily placed laterally in the position for proper pick-up of the chip. The tool is further keyed visually to assure placement of the chip on its socket only in the proper orientation, and is also physically keyed to aid in proper placement of the chip on the socket. In the preferred embodiment wherein the chip is generally square in its major dimensions, and is presented in a tray having corresponding square pockets for holding the chips and having depressions molded in the tray near and beyond each corner of the pocket, the vacuum tool is preferably provided at its forward or working end with four corresponding tray-alignment pins, one at each corner and each of a size and location such that all four fit simultaneously into the tray depressions when the tool is properly positioned transversely, thereby to provide the desired lateral alignment. The tray and the tool are preferably also provided with visible orienting indicia, such as a dot on the tool and a bevelled corner on the tray, whereby the user can easily orient the tool so that the orientation between tool and tray, and therefore the chip, is correct. Preferably also, the depressions and pins are placed so that the pins of the tool can only enter the depressions in the tray in two orientations of tool with respect to the tray, as a safety measure. For convenience, these pins will be referred to herein as tray-alignment pins.

In addition, in the preferred embodiment the tool is provided with a recess on the working face confronting the chip, into which recess the chip fits closely when sucked up by a vacuum in the tool, whereby the lateral position of the chip with respect to the tool is accurately defined by the recess, so that when the tool is later placed in a predefined proper position with respect to the socket, it will discharge the chip properly onto that socket.

In the preferred embodiment wherein the socket is provided with post-like protrusions rising from its four corners, the tool is also provided with additional guide means in the form of two additional pins at each corner, each shorter than the pins which provide positioning with respect to the tray, and forming a nest of pins at each corner fitting closely about and against each post-like protrusion when the chip is in its proper position on the socket, whereby proper lateral placement of the chip on the socket is assured. For convenience, the additional pins are referred to herein as socket-alignment pins, since they are used in connection with aligning the chip with the socket. Visible indicia on the tool and socket, such as a dot on the tool help to assure that the tool is also properly oriented on the socket, prior to its discharge onto the socket.

Also preferably, the air system used for picking up the chip also provides for discharging the chip from the tool by air pressure after its placement on the socket. This is preferably accomplished by using as the source of vacuum a Venturi type of vacuum pump, in which the vacuum is generated by a positive flow of air through a narrow opening; the resultant vacuum is supplied through an air line to the working face of the tool, to provide suction for picking up the chip and holding it in the tool. The positive flow of air from the Venturi is passed through a second air line to the tool, where it is normally exhausted to atmosphere through an opening in the wall of the tool. Switching between vacuum lifting of the chip and discharging of the chip onto the socket is accomplished by first uncovering and later covering an exhaust port on the tool with a digit of the hand holding the tool; either hand can be used. When the opening is uncovered, it permits an exhaust flow of air from the Venturi to occur, by way of the second air line; the air flows out of the tool opening, and the resultant desired vacuum is maintained at the working face of the tool to pick up the chip and hold it while conveying it to the socket. To accomplish placement of the chip on the socket, a finger is placed over the tool air-exhaust opening, which stops the flow of air through the Venturi orifice and thereby eliminates the vacuum, and causes the pressurized air from the Venturi pump to flow instead through the vacuum line to the tool working face, where it, in effect, blows against the chip sufficiently to release it from the tool and drop it on the socket. A locking cover is then applied to the top of the chip-and-socket combination, and pressed downwardly to complete the assembly process.

There is thereby provided a hand-held tool, a system, and a method for accomplishing proper manually-controlled vacuum pick-up of a chip from tray, transfer of the chip to a socket and subsequent accurate, proper placement of the chip in the socket, in a manner which is nearly fool-proof and expedient even for a relatively unskilled operator.

BRIEF DESCRIPTION OF THE DRAWINGS

These and other objects and features of the invention will be more readily understood from a consideration of the following detailed description, taken with the accompanying drawings, in which:

FIG. 10 is a side elevational view of the exterior of the tool, seen from the side on which the exhaust port is located;

FIG. 11 is a vertical sectional view taken along lines 11—11 of FIG. 10, showing the exhaust passageway within the tool;

FIG. 12 is a vertical sectional view taken along lines 12—12 of FIG. 10, showing the vacuum and chip discharge passages in the tool;

DETAILED DESCRIPTION OF THE INVENTION

Figure 1:
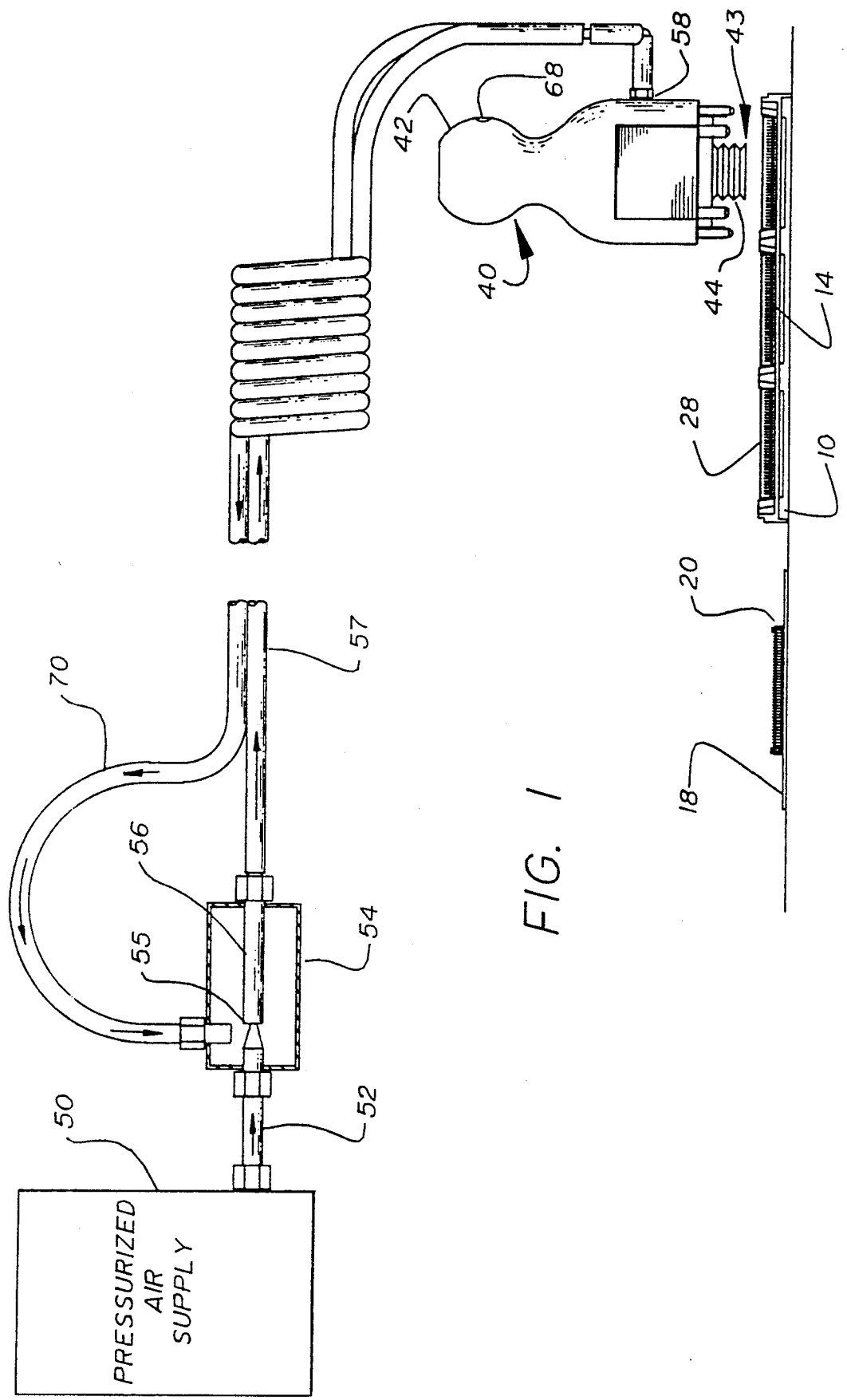
FIG. 1 is a schematic view of a complete system according to a preferred embodiment of the invention, as used to transfer a chip from a tray to a socket.
Figure 8:
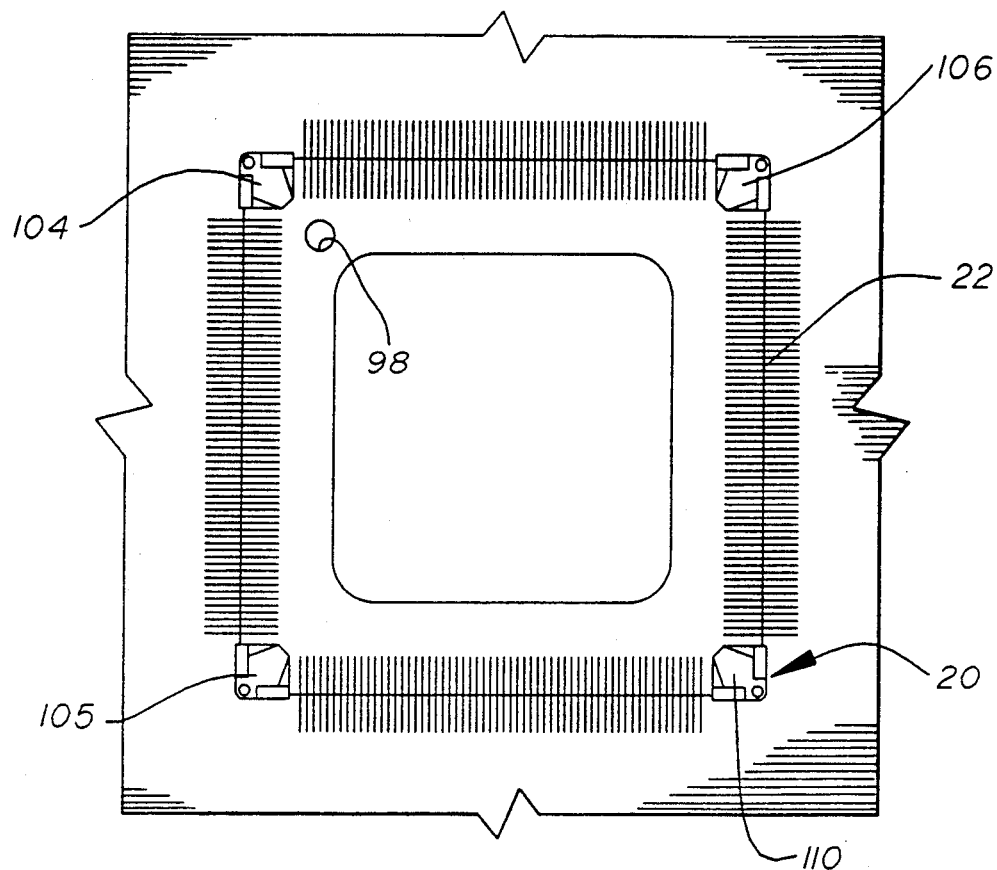
FIG. 8 is an enlarged plan view of a socket to which the chip is to be applied.
Figure 9:
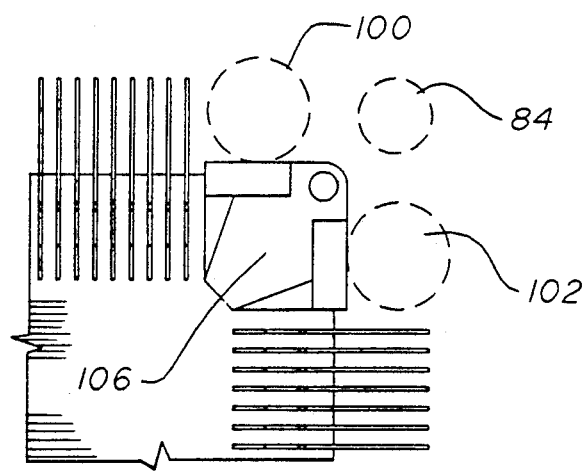
FIG. 9 is an enlarged, fragmentary plan view of one corner of the socket of FIG. 8, showing in broken line the positions of the tray pin and two socket-alignment pins, all carried by the tool.

Referring now to the preferred embodiment of the invention shown in the drawings by way of example only, FIG. 1 shows a tray 10 of molded plastic having a plurality of square pockets such as 12 (FIG. 5) molded into its top, in which square computer chips such as 14 lie, as they are presented by the manufacturer. A printed-circuit board 18 supports a chip socket 20 (FIG. 87 on which one of the chips is to be placed. The chip socket has its leads 22 (FIG. 8) soldered to appropriate corresponding solder pads (not shown) on the circuit board, much as the chip would otherwise be soldered in place on the PC board; by using a socket. the chip which is placed in the socket can later be removed and replaced by another, should it be or become faulty, or to replace the chip for up-grading, for example.

Figure 13:
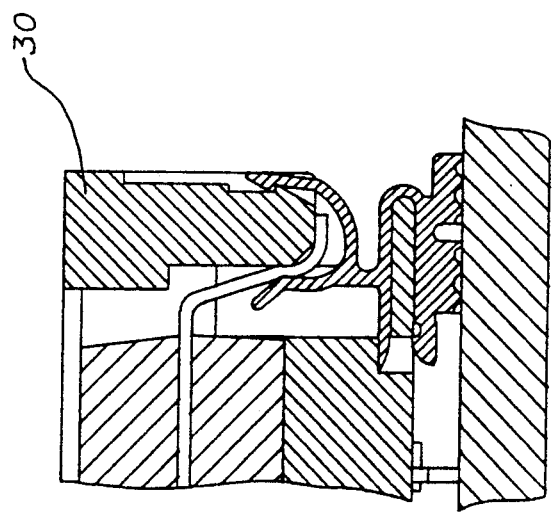
FIG. 13 is an enlarged fragmentary view of a representative contact of the socket and a representative contact of the chip, as they are being pressed together by the locking cover.

Previously, hand loading of the chips from the tray 10 to the socket 20 was done by grasping a chip directly with the fingers, lifting it from the tray, turning it about to examine it while hand-held, and then transferring it by hand onto the socket 20; the leads such as 28 of the chip (FIG. 5) are then pressed downward by a locking cover 30 (FIG. 13, shown in fragment only), until the leads of the socket and the leads of the chip are held in positive electrical contact with each other as desired; however, by removing the locking cover, the chip can be accessed to lift it free of the socket for replacement with another chip, for example.

Returning to FIG. 1, according to the invention the chip 14 is to be lifted from the tray 10 by means of a hand-held two-mode vacuum tool 40, having a handle portion 42 and a working face 43 with collapsible bellows suction cup 44. Grasping the handle in the hand, the chip to be moved is contacted from above by the suction cup, with the tool in its vacuum mode to pick up the chip; the handle is then lifted and manipulated by hand to inspect the chip, and if it appears to be sound, it is carried on the tool to a position above the socket 20. The tool is lowered over the socket until the tray pins rest on the PC board. The tool mode is then switched by a finger, as described below, to the chip-discharge mode, thereby to deposit the chip on top of the socket as desired.

Figure 3:
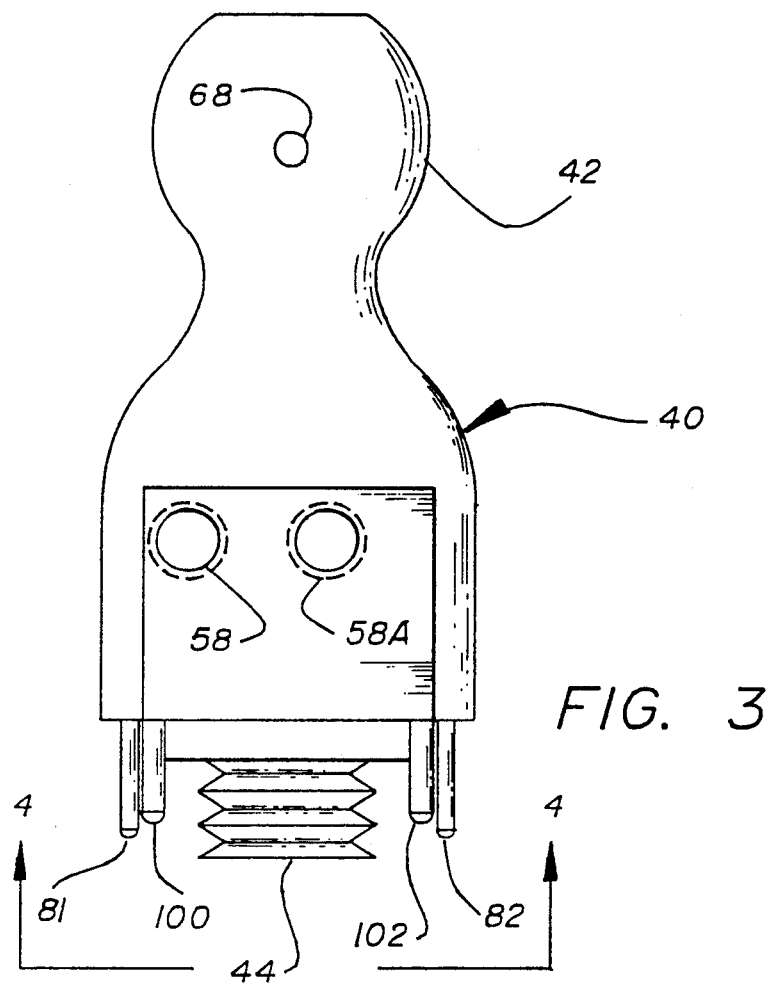
FIG. 3 is a side elevational view of the tool of FIGS. 1 and 2, enlarged and rotated by 90°.

More particularly, as shown in FIG. 1 a regulated pressurized air source 50 supplies a flow of air over air line 52 to a Venturi pump 54, shown diagrammatically. In the vacuum mode of tool 40, the air flows through a narrow orifice 55 in the Venturi pump and through a tube 56 to a spring-coiled flexible air line 57; in this mode, the air then flows, as the arrows of FIG. 1 show, into exhaust air inlet port 58 of the tool 40 (FIGS. 10 and 11) and through exhaust passages 64 and 66 in the tool, to the air exhaust port 68 where it exits the tool. This flow of exhaust air produces a vacuum in pump 54 near Venturi orifice 55, which sucks in air by way of vacuum air line 70, vacuum port 58A (FIG. 3), and tool passages 72 and 73 (FIG. 12) so that a vacuum appears in suction cup 44 at the bottom working face 43 of the tool, as desired when a chip is to be picked up and transported.

Figure 2:
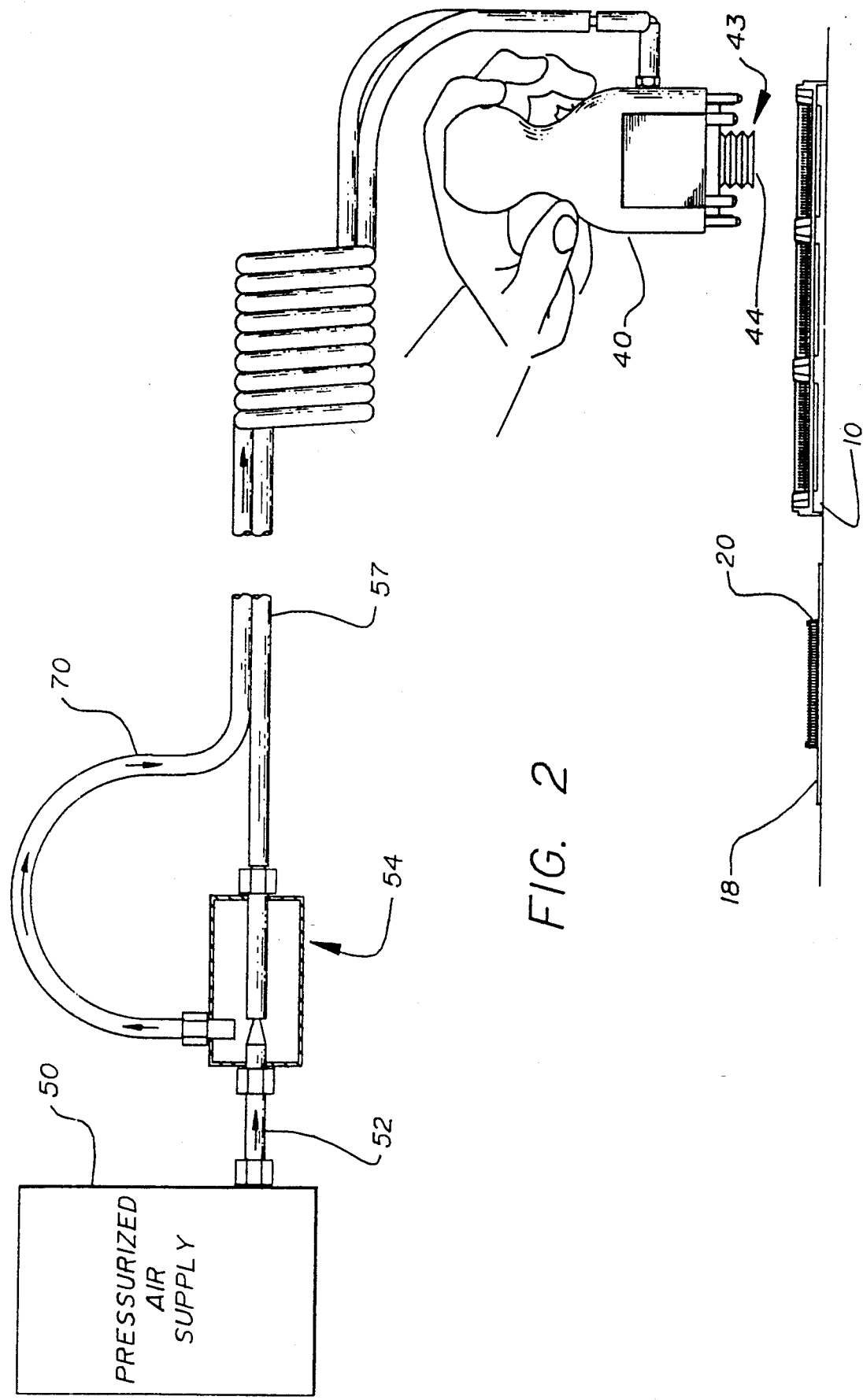
FIG. 2 is a view like FIG. 1, but showing the operator's hand in position to grip the tool and to close off the exhaust opening or port with an index finger of the carrying hand, when the chip is to be discharged from the tool.
Figure 4:
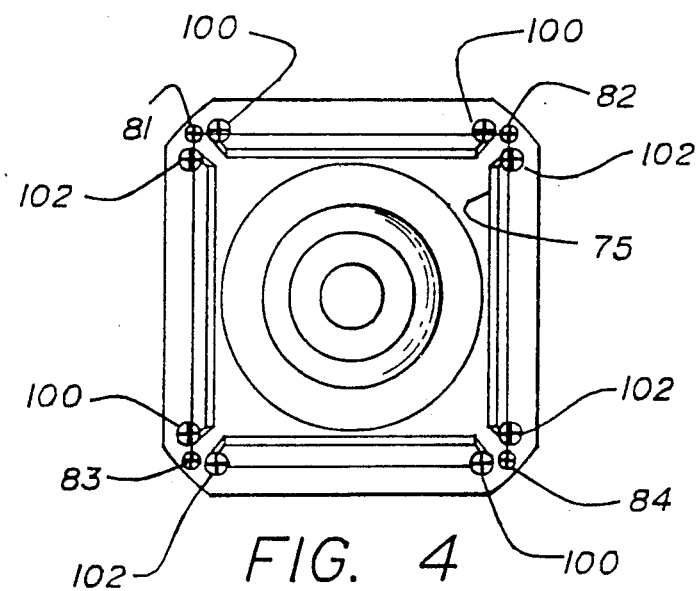
FIG. 4 is a bottom plan view of the tool of FIG. 3.
Figure 7:
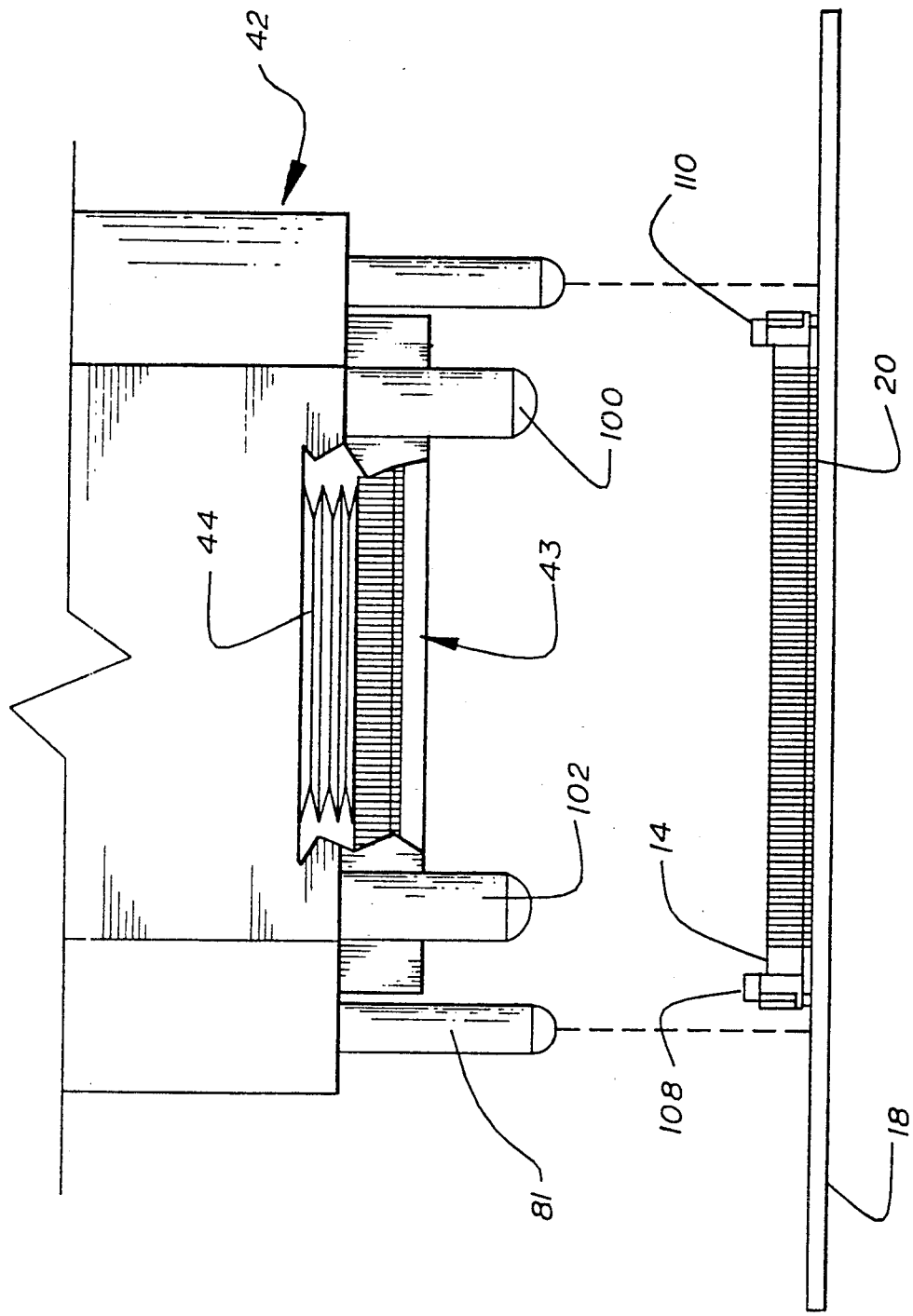
FIG. 7 is an enlarged fragmentary side elevational view of the working end of the tool carrying a chip, and aligned with a chip socket preparatory to depositing the chip in the socket.

With the tool in this vacuum mode, it is placed by hand over chip 14 in tray 10 so that the suction cup contacts the upper side of the chip and sucks it up into the corresponding square recess 75 (FIGS. 4 and 7) in the working face of the tool. The tool is then manipulated by the hand which holds it to permit close examination of the leads, and if everything is in order, moved by hand to a position above the socket 20, at which time the tool exhaust opening 68 is covered by a digit of the hand which holds the tool. The effect of this is to stop the flow of exhaust air in line 57 and to cause a discharge flow of air in air line 70 (see arrows in FIG. 2) which passes through passages 72 and 73 in tool 10 to the suction cup 44, where it impinges the chip and urges it downward, free of the tool, onto the top of the socket, after which the locking cover whose section is shown in FIG. 13 is applied to lock the chip and socket leads in contact with each other, as desired.

Figure 14:
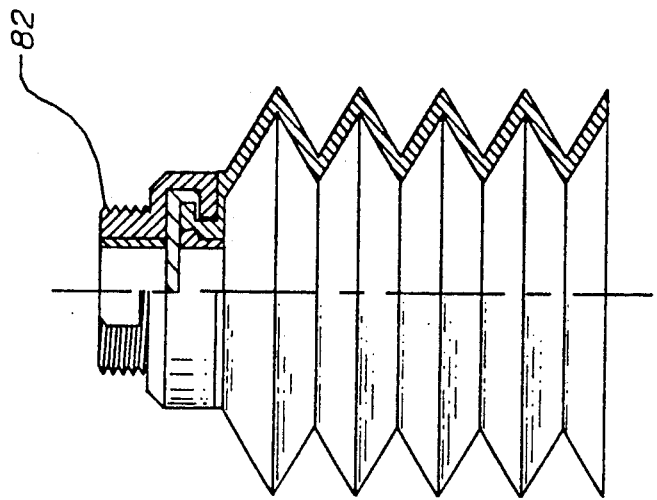
FIG. 14 is an enlarged fragmentary view of a standard suction cup arrangement, used in the preferred embodiment of the invention.

FIG. 14 shows a preferred arrangement for holding the bellows type of suction cup 44 in the bottom of the working face of the tool, although other arrangements may be used. In the example shown, a commercially-available suction cup assembly is used which has threads 82 at its upper end permitting it to be screwed into the threaded lower end of vacuum passage 73.

In the above-described operation it is important to assure that the tool will easily be properly aligned above the chip, as well as properly oriented, when the chip is to be picked up from the tray; and that the tool later be properly aligned and oriented with respect to the socket when it is time to place the chip properly on the socket. These aspects will now be discussed.

Figure 5:
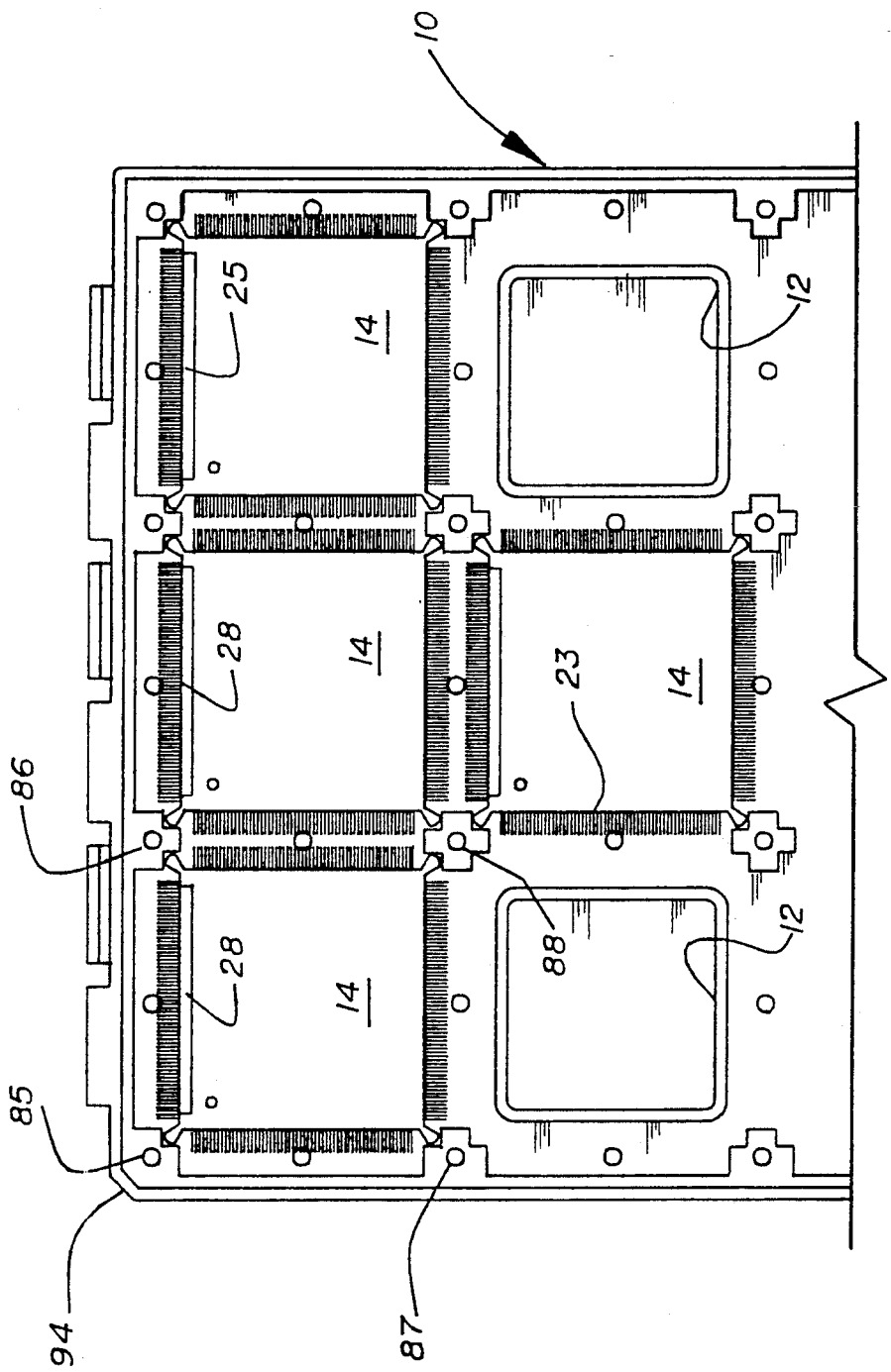
FIG. 5 is an enlarged plan view of the tray with the chips in it.
Figure 6:
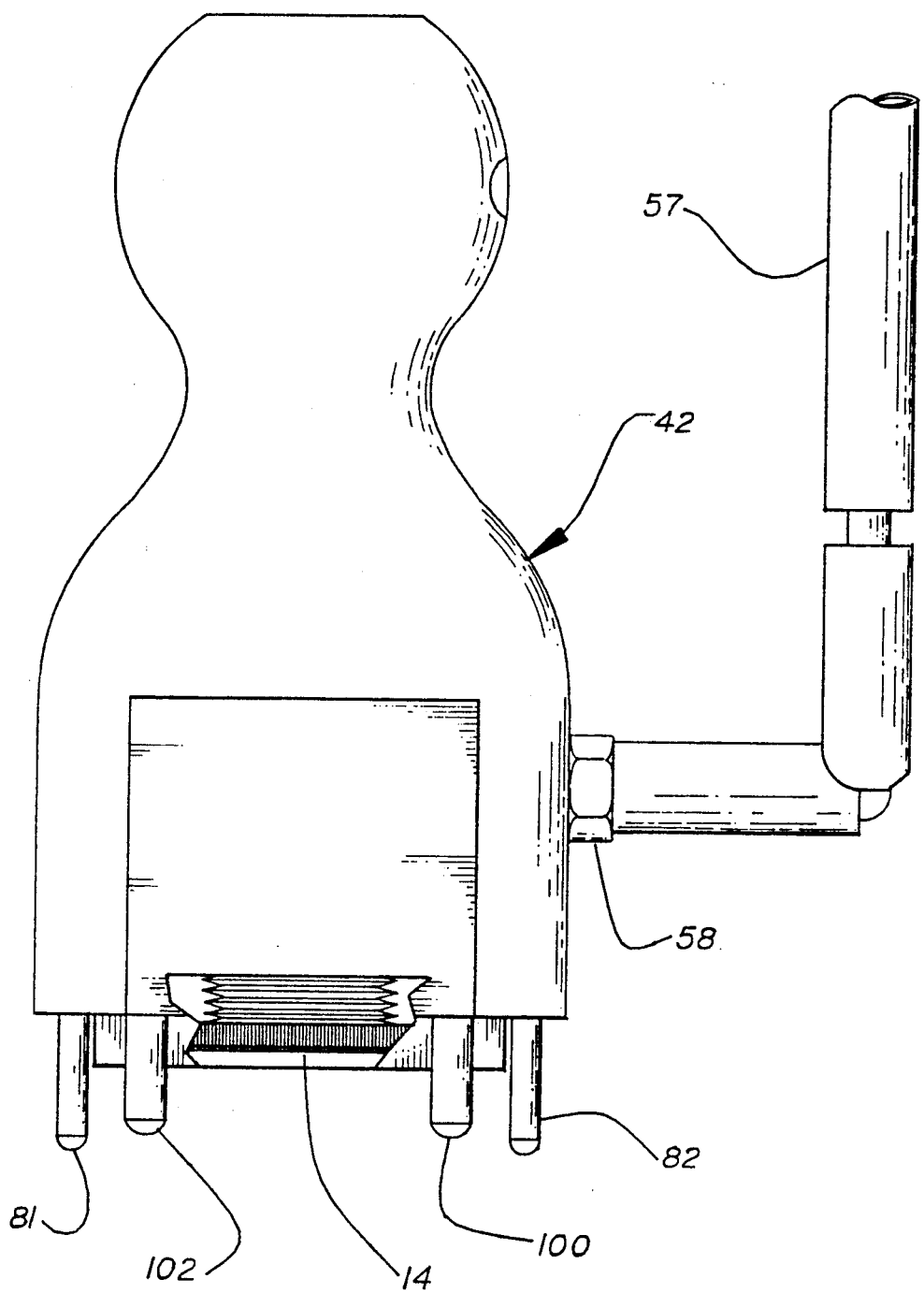
FIG. 6 is an enlarged side elevational view of the tool, carrying a chip on its bottom working face.

In order to align the working face of the tool easily with the chip during chip pick-up, the working face is provided with a physical lateral-alignment keying structure in the form of four pins 81, 82 and 83, 84 (FIGS. 3 and 4), here called "tray pins", which when the tool is properly aligned laterally are easily urged into four corresponding keying elements on the tray, such as the four depressions 85, 86, 87 and 88 (FIG. 5). The distal tips of these pins are preferably beveled to facilitate guiding them into the depressions.

Figure 15:
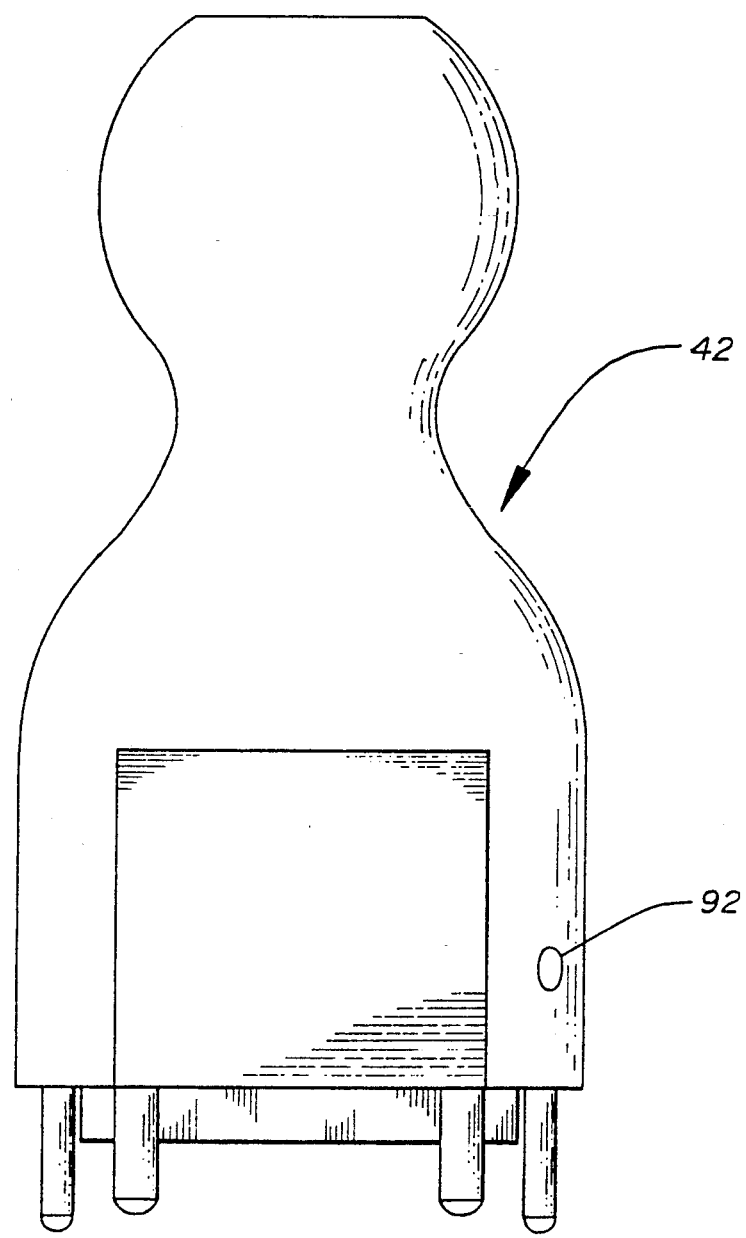
FIG. 15 is a side elevational view of the tool and chip as shown in FIG. 6, but turned 180° about a vertical axes to show the orienting dot.

To assure proper mutual orientation of tool and chip during chip pick-up, the tool and the tray are provided with keyed visual indicia in the form of an easily-visible color-contrasting dot 92 (FIG. 15) or the like on the side of the tool and near its working face, and a beveled corner 94 at only one corner of the tray. The chips are originally presented in the tray in one known orientation and therefore, by always presenting the tool with the dot in the same relationship to the beveled cover, the chip will be picked up in the desired orientation; thus with the beveled corner of the tray at the upper left as in FIG. 2, the tool will be applied to each chip so that the dot 92 is at the upper left of the chip. Suitably, the dot is white and the tool surface black, which also makes it easier to see the metallic leads during visual inspection.

As noted above, during transportation of chip from tray to socket, it is reliably held in a fixed orientation by being sucked into a conforming square recess 75 in the bottom working face 43 of the tool 10. When the tool is placed over a socket on which the chip is to be discharged, the dot 92 is oriented toward visual indicia on the socket, in this example the hole 98 in the socket (FIG. 8), to obtain the proper orientation of chip on socket.

To provide the desired lateral alignment, a pair of pins such as 100, 102 (FIG. 3 and 4), designated socket-alignment pins, are located at each corner of the tool, one in each side of the corresponding tray pin, to form a nest of two pins at each corner which fits closely about and against the corresponding corner posts (104, 106, 108 and 110 in FIG. 8) extending upwardly from the socket. The socket-alignment pins do not interfere with the picking up of the chip, since they are shorter than the tray pins and do not contact the tray. With the tool so oriented and located, and with the tray pins (81, 82, 83 and 84 FIG. 4) resting on the PC board, it is in the proper position for the holder of the tool to place a digit over the exhaust aperture 68, thereby to dislodge the chip and move it into top of the socket as desired.

While the visual and physical keying structures are described in one specified form, they may be embodied quite differently, to provide the same functions.

For example, some of the advantages of the invention may be realized by using the type of vacuum tool described herein but with no indicia to aid in orienting, and/or with no physical keying members to aid in lateral placement, with respect to the tray and/or with respect to the socket. Further, some of the advantages of the invention can also be realized by using visual indicia as an aid in orienting, and physical keying members to assist in lateral placement, while using a tool other than a vacuum tool for picking up the electrical component, carrying it to the socket, and discharging it there.

Thus while the invention has been described with particular reference to specific embodiments in the interest of complete definiteness, it will be understood that it may be embodied in a variety of forms diverse from those specifically shown and described, without departing from the spirit and scope of the invention.

We claim:

1. A system for picking up a small electrical component, in a proper orientation, for inspection and transporting the component between a container and placement in a socket, comprising:
   a hand-held tool operated by the hand of the holder to pick up, transport and discharge the component;
   visually-observable indicia on said tool for indicating a predetermined proper orientation of the tool with respect to the component and the socket;
   physical keying members on said tool that include
       a first set of pins that cooperate with the container to properly position the tool relative the container for picking up or discharging the component and
       a second set of pins that cooperate with the socket to properly position the tool relative the socket for picking up or discharging the component.

2. The system of claim 1, wherein the pins are cylindrical.

3. The system of claim 1, wherein the component is received in a working face of the tool and a pressurized-air system having associated air lines for supplying to said working face either a vacuum for picking up the component or a positive pressure for discharging the component from the tool, as controlled by a digit of the hand of the operator holding the tool.

4. The system of claim 3, wherein the tool includes internal passages and an exhaust port, the internal passages being interconnected with the working face, the exhaust port, and the associated air lines to provide a vacuum or positive pressure at the work face in response to covering or uncovering the exhaust port by the digit of the holder.

5. The system of claim 1, wherein the second set of pins are longer than the first set of pins.

6. A system for picking up a small electrical component, in a proper orientation, for inspection and transporting the component between a container and a socket, comprising:
- a hand held vacuum tool having a handle, a working face, an exhaust port that is coverable and uncoverable in response to movement of a digit of the holder of the tool, and internal passages within the tool that communicate with the working face and the exhaust port;
- first posts on the working face of the tool that cooperate with the container to properly position the tool relative the container for picking up or discharging the component thereto;
- second posts on the working face of the tool that cooperate with the socket to properly position the tool relative the socket for picking up or discharging the component thereto, the second posts further cooperating with the component to maintain the proper orientation of the component when picked up by the tool;
- visually-observable indicia on said tool for indicating a predetermined proper orientation of the tool with respect to the component and the socket; and
- a pressurized-air system and associated air lines interconnected with the internal passageways in the tool to provide vacuum or positive pressure at the working face in response to the covering and uncovering of the exhaust port.

7. The system of claim 6, wherein the first posts and the second posts cylindrical are protrusions from the working face.

8. The system of claim 6, wherein the second posts extend from the working face further than the first posts.

9. The system of claim 6, wherein a suction cup extends from the working face of the tool to maintain the vacuum between the tool and the component.

10. A system for picking up a small electrical component, in a proper orientation, for inspection and transporting the component between a container and placement in a socket, comprising:
- a hand-held tool operated by the hand of the holder to pick up, transport and discharge the component;
- visually-observable indicia on said tool for indicating a predetermined proper orientation of the tool with respect to the component and the socket;
- physical keying members on said tool that include
  - a first set of physical keying members that cooperate with the container to properly position the tool relative the container for picking up or discharging the component and
  - a second set of physical keying members that cooperate with the socket to properly position the tool relative the socket for picking up or discharging the component thereto, the second set of physical keying members further cooperating with the component to maintain the proper orientation of the component when picket up by the tool to assure proper placement in the socket.

* * * * *

UNITED STATES PATENT AND TRADEMARK OFFICE
CERTIFICATE OF CORRECTION

PATENT NO. : 5,314,223
DATED : May 24, 1994
INVENTOR(S) : Donald K. Harper, Jr., et al.

It is certified that error appears in the above-identified patent and that said Letters Patent is hereby corrected as shown below:

In claim 10, column 8, line 30, "picket" should be --picked--

Signed and Sealed this

Sixth Day of September, 1994

Attest:

BRUCE LEHMAN

Attesting Officer

Commissioner of Patents and Trademarks